US008165199B2

(12) United States Patent
Xiu et al.

(10) Patent No.: US 8,165,199 B2
(45) Date of Patent: Apr. 24, 2012

(54) METHOD AND APPARATUS FOR ON-CHIP VOLTAGE CONTROLLED OSCILLATOR FUNCTION

(75) Inventors: Liming Xiu, Plano, TX (US); Grady Cook, Plano, TX (US); Daniel Dudek, Flower Mound, TX (US); Hongbing Lian, Plano, TX (US); Yihe Hu, Frisco, TX (US); Christopher S. Tracy, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 856 days.

(21) Appl. No.: 12/254,381

(22) Filed: Oct. 20, 2008

(65) Prior Publication Data

US 2009/0103604 A1 Apr. 23, 2009

Related U.S. Application Data

(60) Provisional application No. 60/980,891, filed on Oct. 18, 2007.

(51) Int. Cl.
*G06F 1/04* (2006.01)
*H03D 3/24* (2006.01)
(52) U.S. Cl. .................. 375/240.01; 713/600
(58) Field of Classification Search ............ 375/240.01
See application file for complete search history.

(56) References Cited

U.S. PATENT DOCUMENTS

| 6,724,825 | B1 * | 4/2004 | Nemiroff et al. ........ 375/240.27 |
| 6,829,304 | B1 * | 12/2004 | Cole ........................ 375/240.27 |
| 6,937,988 | B1 * | 8/2005 | Hemkumar et al. ......... 704/500 |
| 7,865,021 | B2 * | 1/2011 | Tsuboi ........................ 382/232 |
| 2003/0058948 | A1 * | 3/2003 | Kelly et al. ............. 375/240.26 |

OTHER PUBLICATIONS

Xiu et al., "A Novel All-Digital PLL With Software Adaptive Filter", Mar. 2004, IEEE Journal of Solid-State Circuits, vol. 39, No. 3, pp. 476-483.*
Xiu, Liming, "A "Flying-Adder" On-Chip Frequency Generator for Complex SoC Environment", Dec. 2007, IEEE Transactions on Circuits and Systems, vol. 54, No. 12, pp. 1067-1071.*
Xiu et al., "A "Flying-Adder" Frequency Synthesis Architecture of Reducing VCO Stages", Feb. 2005, IEEE Transactions on Very Large Scale Integration (VLSI) Systems, vol. 13, No. 2, pp. 201-210.*

* cited by examiner

*Primary Examiner* — Matthew Smithers
(74) *Attorney, Agent, or Firm* — Robert D. Marshall, Jr.; W. James Brady; Frederick J. Telecky, Jr.

(57) ABSTRACT

This invention uses a flying adder frequency synthesis circuit to provide the required frequency adjustments to accommodate the varying encoding density of a MPEG2 video data stream. This invention adjusts the local clock based on the information extracted from the program clock reference signal in the incoming data. This invention replaces an external or internal voltage-controlled crystal oscillator using a phase locked loop circuit on the video processing integrated circuit.

4 Claims, 6 Drawing Sheets

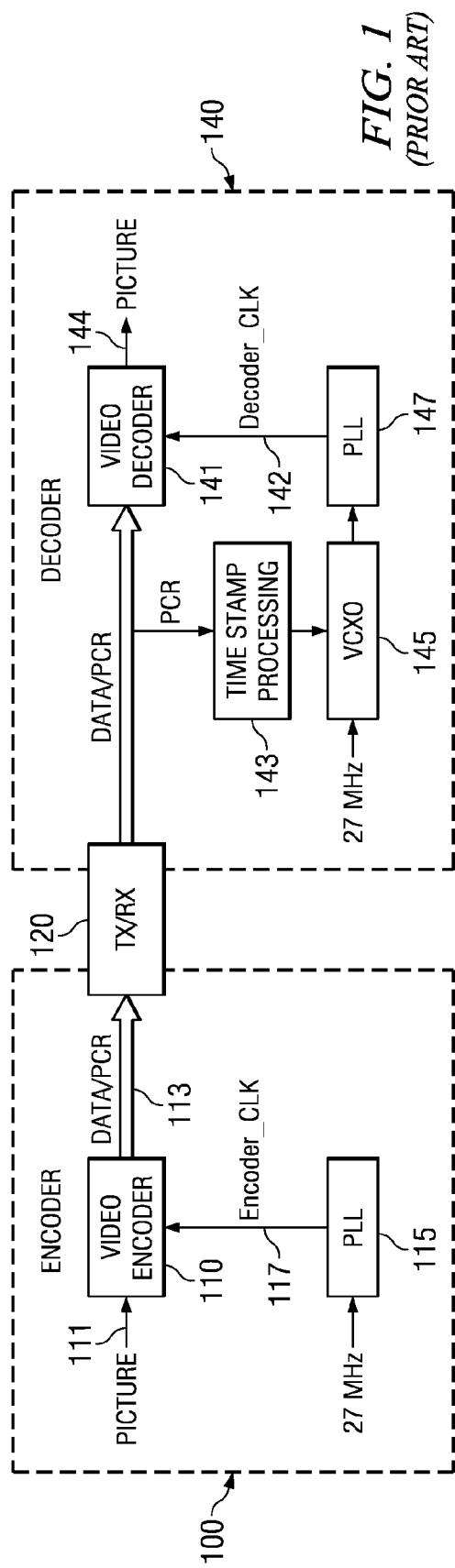
FIG. 1 *(PRIOR ART)*
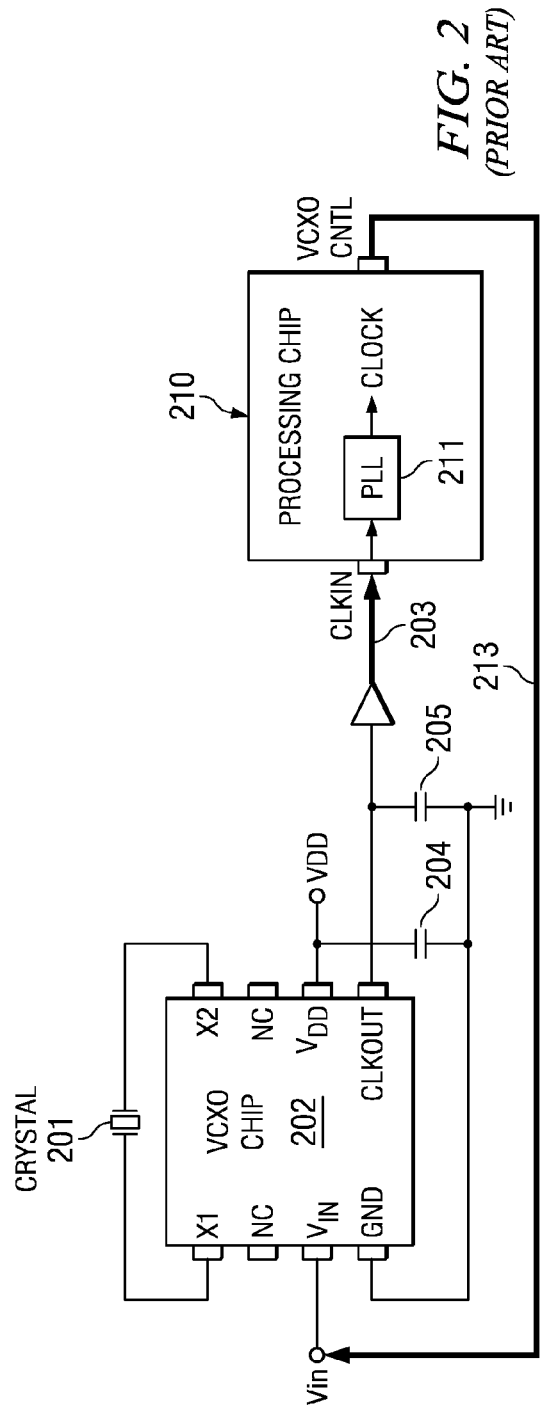
FIG. 2 *(PRIOR ART)*

METHOD AND APPARATUS FOR ON-CHIP VOLTAGE CONTROLLED OSCILLATOR FUNCTION

CLAIM OF PRIORITY

This application claims priority under 35 U.S.C. 119(e)(1) to U.S. Provisional Application No. 60/980,891 filed Oct. 18, 2007.

TECHNICAL FIELD OF THE INVENTION

The technical field of this invention is providing clock signal to a video decoder.

BACKGROUND OF THE INVENTION

In some applications, especially TV related, the system needs to capture the incoming received radio frequency data. In these applications the data rate is not constant but has small variations. The local clock needs to adjust from time to time to reliably latch this type of data. This invention deals with the problem of how to align the local clock with this incoming data.

FIG. 1 illustrates the block diagram of MPEG2 data stream transmission/reception used in digital TV satellite broadcast. Encoder 100 includes video encoder 110 and phase locked loop (PLL) 115. PLL 115 receives a stable 27 MHz reference signal generally from a piezoelectric crystal controlled oscillator (not shown) and generates encoder_CLK 117. Video encoder receives picture data 111 and encoder_CLK 117. Video encoder 110 produces an encoded data stream 113 including picture data and program clock reference information according to the MPEG2 video encoding standard.

The MPEG2 encoding standard generates picture data with varying coding densities dependent upon the particular frame data being encoded. Generally more busy frames require more data encode as compared with less busy frames. In the MPEG2 encoding standard the encoder regularly inserts a program clock reference (PCR) signal as a timestamp. The standard requires one such PCR signal at least every 100 ms for a data rate of greater than 10 Hz. Each PCR signal indicates the elapsed time in the original and decoded video stream. The use of the PCR signals will be explained below.

The encoded signal 113 is transmitted from the encoder 100 to the decoder 140. In this example the transmission is via earth orbiting satellite to an earth based receiving station. The transmission could also be by terrestrial digital radio broadcast, cablecast or storing the encoded video signal on a portable digital storage medium (DVD, Blue ray disk) and physical transportation to a suitable reader at the decoder.

Decoder 140 includes video decoder 141, time stamp processing circuit 143, voltage controlled crystal oscillator (VCXO) 145 and phase locked loop (PLL) 147. The received input signal is split. The video data to be decoded is supplied to video decoder 141. The PCR signals are supplied to time stamp processing circuit 143. Time stamp processing circuit 143 determines the deviation of the indicated time of PCR signals and the corresponding real elapsed time. VCXO 145 generates an output having small deviations in frequency from a stable 27 MHz signal generally from a piezoelectric crystal controlled oscillator (not shown) corresponding to the deviations detected by time stamp processing circuit 143. This output controls PLL 147 which supplies decoder_CLK signal 142 to video decoder 141. Decoder_CLK 142 controls the rate of decoding operation in video decoder 141. Thus decoding tracks the small deviations introduced in encoder 100. The output of video decoder 141 is picture signal 144. In the MPEG2 encoding standard decoder_CLK 142 is 27 MHz±810 Hz.

FIG. 2 illustrates a block diagram of a typical prior art technique embodying decoder 140 illustrated in FIG. 1. VCXO 145 is embodied by an external VCXO chip 202 connected to piezoelectric crystal 201. External VCXO chip 202 supplies a clock signal CLKIN 203 to an input of processing chip 210. As shown in FIG. 2, clock signal CLKIN 203 supplies PLL 211 (corresponding to PLL 147) which controls operations in processing chip 210. Processing chip 210 generates a VCXO CNTL signal 213 corresponding to the error signal produced by time stamp processing circuit 143. This is connected to a Vin input of VCXO chip 202. VCXO chip adjusts the frequency of clock signal CLKIN 203 dependent upon the voltage level of VCXO CNTL signal 213. This circuit typically also includes external capacitors 204 and 205 as shown in FIG. 2. This external VCXO chip implementation is often used to achieve the required pulling range, linearity, frequency resolution, modulation rate, slope polarity, slope sensitivity and stability needed for the application. This implementation is also often used because many vendors produce stand alone VCXO chips such as VCXO chip 202. It is also technically feasible to incorporate the circuits of VCXO chip 202 within the processing chip. This prior art technique results in extra expense for the external VCXO chip 202 or integrated circuit area needed for an internal VCXO function.

SUMMARY OF THE INVENTION

This invention uses a flying adder frequency synthesis circuit to provide the required frequency adjustments to accommodate the varying encoding density. This VCXO (more properly called a DCXO for Digital Control Crystal Oscillator) adjusts the local clock based on the information extracted from the program clock reference signal in the incoming data. Compared with known techniques, this invention involves minimum cost.

Traditionally, the VCXO function is achieved by either an external VCXO chip or an on-chip VCXO hardware block. This invention uses a built-in feature of a flying-adder PLL. This invention provides the following advantages:

1. Low cost. The flying-adder VCXO of this invention employs existing circuits and thus includes no extra hardware cost. This invention eliminates the external VCXO chip or the on-chip VCXO which usually use significant integrated circuit area.

2. Easy operation. The flying-adder VCXO of this invention is controlled by digital words which can be directly fed from a software algorithm. This eliminates a digital to analog conversion ordinarily used in most VCXO circuits.

3. Precise frequency response. The frequency response of flying-adder VCXO of this invention can be described mathematically. This eliminates uncertainty in the feedback loop and improves control efficiency significantly.

4. Superior characteristic. The flying-adder VCXO of this invention has following characteristics: super linearity of much less than 1%; infinite tuning bandwidth; adjustable tuning step; zero post-tuning drift; and super stability.

BRIEF DESCRIPTION OF THE DRAWINGS

These and other aspects of this invention are illustrated in the drawings, in which:

FIG. 1 illustrates the block diagram of MPEG2 data stream transmission/reception used in digital TV satellite broadcast (prior art);

FIG. 2 illustrates a block diagram of a typical prior art technique embodying the decoder illustrated in FIG. 1;

DETAILED DESCRIPTION OF PREFERRED EMBODIMENTS

Figure 3:
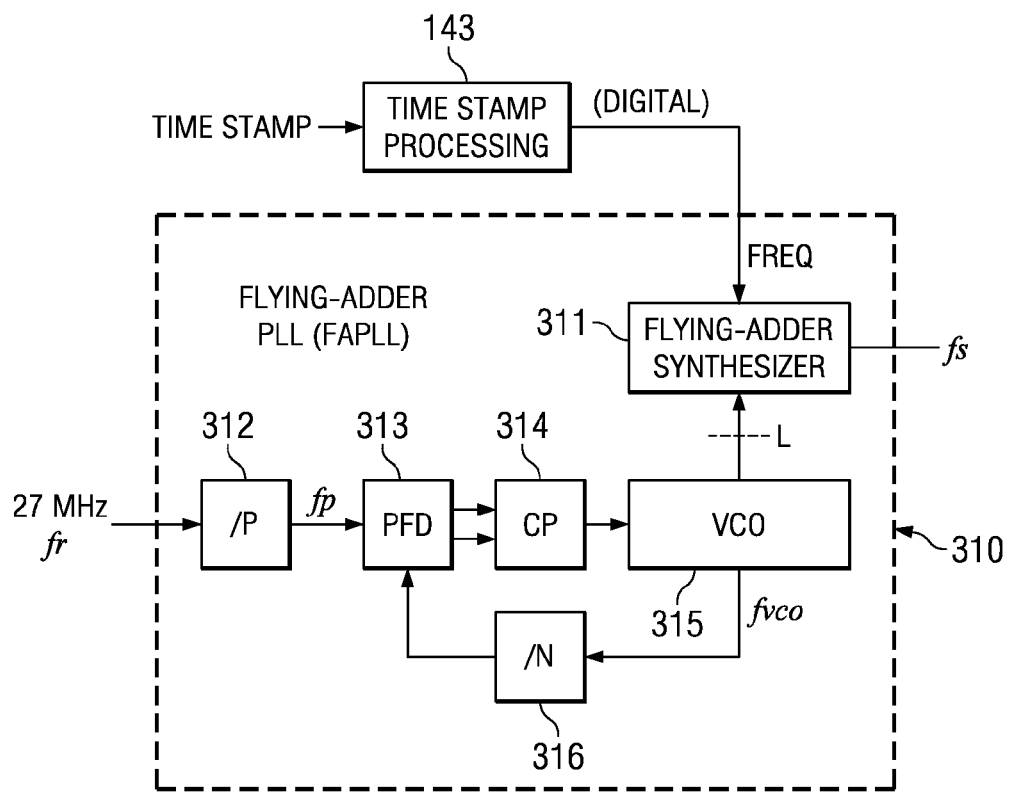
FIG. 3 illustrates the use of a flying-adder synthesizes in this invention.

FIG. 3 illustrates the use of a flying-adder synthesize in this invention. PLL 147 illustrated in FIG. 1 is replaced with flying-adder PLL 310 as shown in FIG. 3. VCXO 145 illustrated in FIG. 1 is eliminated. The output of time stamp processing circuit 143 drives PLL 310 as illustrated in FIG. 3 rather than VCXO 145 as illustrated in FIG. 1.

Flying-adder PLL 310 includes flying-adder synthesizer 311, divide by P (/P) circuit 312, phase detector (PFD) 313, charge pump (CP) 314, voltage controlled oscillator (VCO) 315 and divide by N (/N) circuit 316. /P circuit 312 and /N circuit 316 adjust the frequency relationship between the 27 MHz input frequency and the output frequency of VCO 315. These circuits generally enable any integral ratio N/P between the 27 MHz piezoelectric crystal frequency and the output frequency of VCO 315. PFD 313 compares the phases of the /P signal and the /N signal and produces an error signal which controls VCO 315. CP 314 generates the control signal for VCO 315 from the phase error signal output from PFD 313. Feedback of the VCO 315 signal fvco enables the phase locked loop to reliably generate an output signal having a stable frequency relationship N/P to the 27 MHz input signal.

Figure 4:
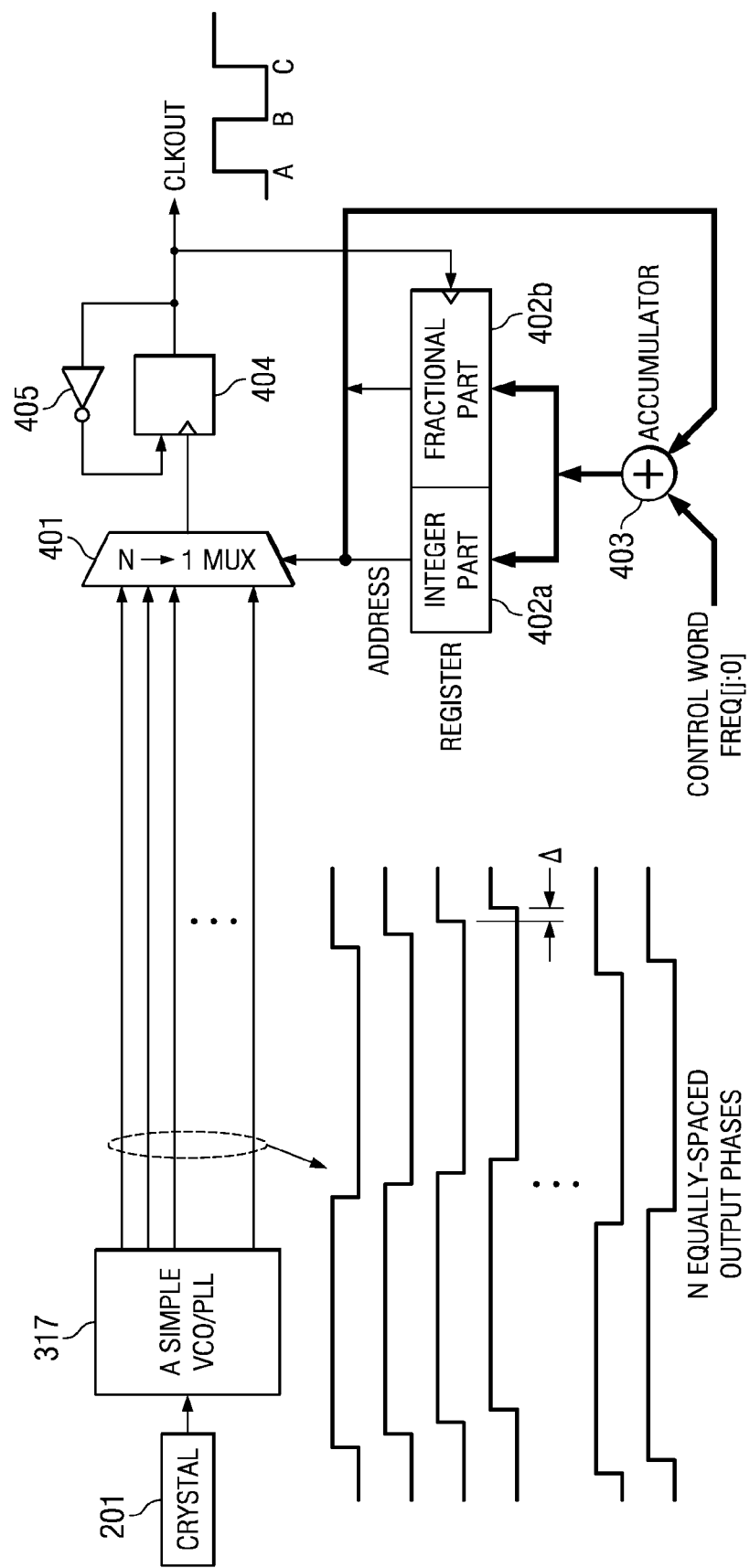
FIG. 4 illustrates an example of the operation of a flying-adder synthesized such as used in this invention.

As better illustrated in FIG. 4, VCO 315 generates a plurality of signals L preferably equally spaced in phase. It is typical to generate these signals L using a chain of delays. Flying-adder synthesizer 311 receives the plural signals L and a digital signal FREQ from time stamp processing circuit 143. Flying-adder synthesizer 311 generates an output signal fs that depends both upon the frequency of plural signals L and the value of digital signal FREQ. This output signal fs supplies the clock driven process of processing chip 210.

FIG. 4 illustrates an example of the operation of a flying-adder synthesized such as used in this invention. Piezoelectric crystal 201 provides a stable frequency standard for VCO/PLL 317. VCO/PLL 317 embodies /P circuit 312, PCD 313, CP 314, VCO 315 and /N circuit 316 illustrated in FIG. 3. FIG. 4 illustrates VCO/PLL 317 producing N equally spaced output signals having a phase spacing of Δ. These N equally spaces output signals correspond to plural signals L illustrated in FIG. 3.

These equally spaced output signals supply respective inputs of N to 1 multiplexer 401. The selection made by N to 1 multiplexer 401 is controlled by integer part 402a of register 402. The selected output of N to 1 multiplexer 401 supplies the clock input of flip-flop 404. Each positive going edge of this output toggles flip-flop 404 to an opposite digital output producing a square wave signal CLKOUT (as shown in FIG. 4) having a controlled frequency. Inverter 405 is coupled to flip-flop 404 to retain its state between clock pulses.

Accumulator 403 adds the current contents of register 402 including an integer part stored in integer part 402a and fractional part 402b to the digital control word FREQ from time stamp processing circuit 143. If the sum overflows, the most significant bit is discarded. The sum produced by accumulator 403 is stored in register 402 at a time controlled by CLKOUT from flip-flop 404. Each time the sum is loaded into register 402 the number stored in integer part 402a selects an input to N to 1 multiplexer 401. The repeated selection of inputs to N to 1 multiplexer 401 and flip-flop 404 produce the desired clock signal CLKOUT.

Flying-adder synthesizer 311 operates as follows. Suppose the digital value FREQ equals N, the number of inputs to N to 1 multiplexer 401. Then every addition within accumulator 403 will over flow to the same integral part. Thus the same input to N to 1 multiplexer 401 will be selected repeatedly. According the frequency of CLKOUT will equal the input frequency from VCO/PLL 317 with a phase dependent upon the initial condition of register 402. If the digital value FREQ is larger than N, the input selected will tend to move within N to 1 multiplexer 401 selecting a phase with a longer delay each cycle. This produces a longer pulse period and hence a lower frequency. If the digital value FREQ is smaller than N, the input selected will tend to move within N to 1 multiplexer 401 selecting a phase with a shorter delay each cycle. This produces a shorter pulse period and hence a higher frequency. The fractional part of FREQ provides additional resolution. Assuming the value of FREQ is constant, continual addition of the fractional causes periodic over flow into the integer part. This causes the input of N to 1 multiplexer 401 to dither between two adjacent intervals. The rate of selection of the two adjacent intervals corresponds to the magnitude of the fractional part. A small fractional part near 0 will most often select the smaller interval and select the larger interval infrequently. A large fractional part near 1 will select the larger interval more often than selecting the smaller interval. A change in the digital value of FREQ will be immediately reflected in the next input of N to 1 multiplexer 401. Thus there is no delay in changing frequencies.

Figure 5:
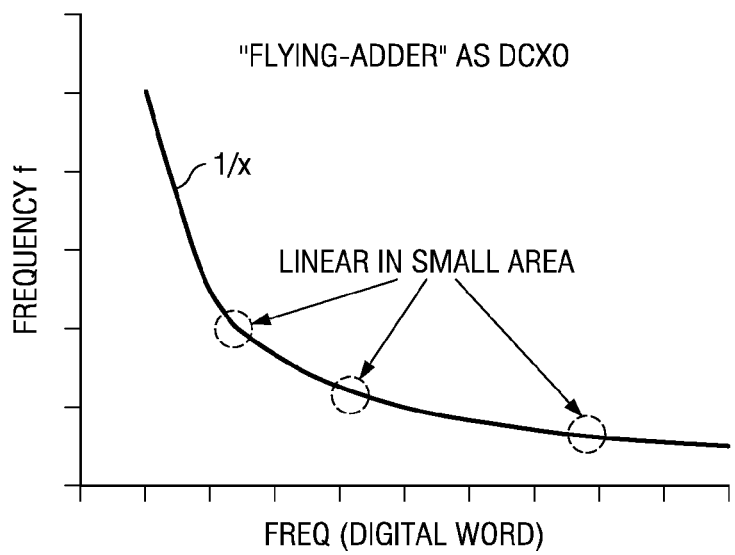
FIG. 5 illustrates the relationship between the digital word and the output frequency f.

The frequency response of a flying-adder synthesizer such as 311 is given as follows:

$$T + FREQ*\Delta \tag{1}$$

or $$f = \frac{1}{FREQ*\Delta}$$

where: T is the output period; FREQ is the digital word; Δ is the phase difference between any two adjacent signals L; and f is the frequency. The frequency curve in general is 1/x and is linear in small area. FIG. 5 illustrates this relationship. In VCXO operation adjusting FREQ yields a new frequency. This adjustment is very small and can be expressed as:

$$FREQ=FREQ_0*(1+x) \tag{2}$$

where: x is small so that $|x|\ll 1$; $FREQ_0$ is a constant in the center of a small range. From equations (1) and (2) we have:

$$f = \frac{1}{\Delta * FREQ_0 * (1+x)} \qquad (3)$$

Note that in a Taylor series expansion:

$$\frac{1}{1+x} = 1 - x + x^2 - x^3 + x^4 - x^5 + \ldots \qquad (4)$$

Thus if $|x|\ll 1$, the higher order terms in equation (4) may be ignored. Combining equation (3) and the thus simplified equation (4) yields:

$$f = \frac{1}{\Delta * FREQ_0} - \frac{x}{\Delta * FREQ_0} \qquad (5)$$

Thus the output frequency is linearly related to the small deviation x in FREQ. The rate of change:

$$\frac{df}{dx} \text{ or } \frac{df}{dFREQ} = -\frac{1}{\Delta * FREQ_0} \qquad (6)$$

These equations make the characteristic of a flying-adder VCXO as follows. The frequency response can be precisely described mathematically as 1/x for small deviations x. The linearity is super being much less than 1%. The tuning Bandwidth is infinite because the flying-adder VCXO instantly follows any update of FREQ. The tuning range is very wide. The size of the tuning step is controllable by the number of bits used in FREQ. There is no post-tuning drift. Stability is not an issue in this circuit any different than any other CMOS circuit. The operation is easy because FREQ is a digital word.

The transfer function of the flying-adder DXCO is $1/(\Delta*FREQ)$. This is valid for the entire operational range from $2 \leq FREQ < 2*L$. This is generally a very wide range, which in a typically a range of hundreds of megahertz. This pulling range is thus very large. Most clock-recovery applications use only a much smaller range of several hundreds of hertz.

In small regions, equation (5) shows the transfer function is very linear. At a given point $x_0$ the transfer function 1/x can be transferred by a straight line tangent at that point. This tangent line is approximately:

$$f_2(x) = -\frac{c}{x_0^2}x + \frac{2c}{x_0} \qquad (7)$$

Defining $\Delta y$ as the difference between two functions at any given point x, equation (8) shows the error between the two functions and can be used as linearity measurement in VCXO specification:

$$\frac{\Delta y}{y} = \frac{(f_1(x) - f_2(x))}{f_1(x)} \approx \left(\frac{\Delta x}{x_0}\right)^2 \qquad (8)$$

The frequency resolution of the flying-adder DXCO is defined as the frequency step is achieved when FREQ is advanced or retreated by one least significant bit (LSB). It can be expressed in equation (9):

$$\delta f = -2^{-k} * \Delta * f^2 \qquad (9)$$

where: k is the number of fractional bits in FREQ; f is the frequency of the synthesizer output; $\delta f$ is the frequency step or resolution at this frequency.

The modulation rate is defined as the rate at which a control voltage change changes the output frequency. Unlike an external DCXO or internal DCXO, a flying-adder DCXO requires no delay in response to control voltage changes. Such a fast response achieves a fast lock in clock recovery.

The slope polarity is defined as the direction of frequency change versus a change in control voltage. The flying-adder DCXO has a negative slope polarity. Thus the frequency decreases for an increase in control voltage magnitude. The transfer function also has a mathematically guaranteed monotonicity, meaning that only one frequency corresponds to each value of the control voltage thus preserving the given order when the control voltage moves in one direction.

Slope sensitivity or slope linearity is the smoothness of VCXO operation. Equation (10) is the slope of the flying-adder VCXO transfer function at any point x.

$$f_1'(x) = -\frac{c}{x^2} \qquad (10)$$

This is a continuous function, which means that the frequency response of the flying-adder VCXO does not change abruptly at any point.

Stability concerns the dependence of the frequency on temperature variations, aging and other factors. Since the inventive flying-adder VCXO is constructed of standard circuit components, this circuit should have no additional stability problem greater than the prior art. The long term stability of the flying-adder VCXO depends upon the quality of the reference crystal.

The following calculation of frequency resolution depends upon a input frequency of 27 MHz and a digital control word FREQ of 25 bits divided into 4 integer bits and 21 fractional bits. In this example P is 1, N is 32 and M is 32. The center value $FREQ_0$ is 8 and FREQ may vary in the range from 7.997038134 to 8.002873021. This provides a DCXO output frequency range of 27 MHz±10 KHz. The fractional part of 21 bits provides a frequency resolution with advance or retreat of the least significant bit (LSB) as calculated below.

$$\Delta = \frac{T_{VCO}}{L} = \frac{1}{(864 \text{ MHz} * 8)} = 144.68 \text{ ps} \qquad (11)$$

From equation (11) the frequency resolution at the synthesizer's output is:

$$\delta f = -2^{-k} * \Delta * f_s^2 \qquad (12)$$
$$= -2^{-21} * (144.68e-12) * (864e6)^2$$
$$= 51.50 \text{ Hz}$$

The resolution at the output $f_0$ with a post divide M of 32 is thus:

$$\delta f = \frac{\delta f_s}{M} = \frac{51.50 \text{ Hz}}{32} = 1.61 \text{ Hz} \tag{13}$$

Figure 6:
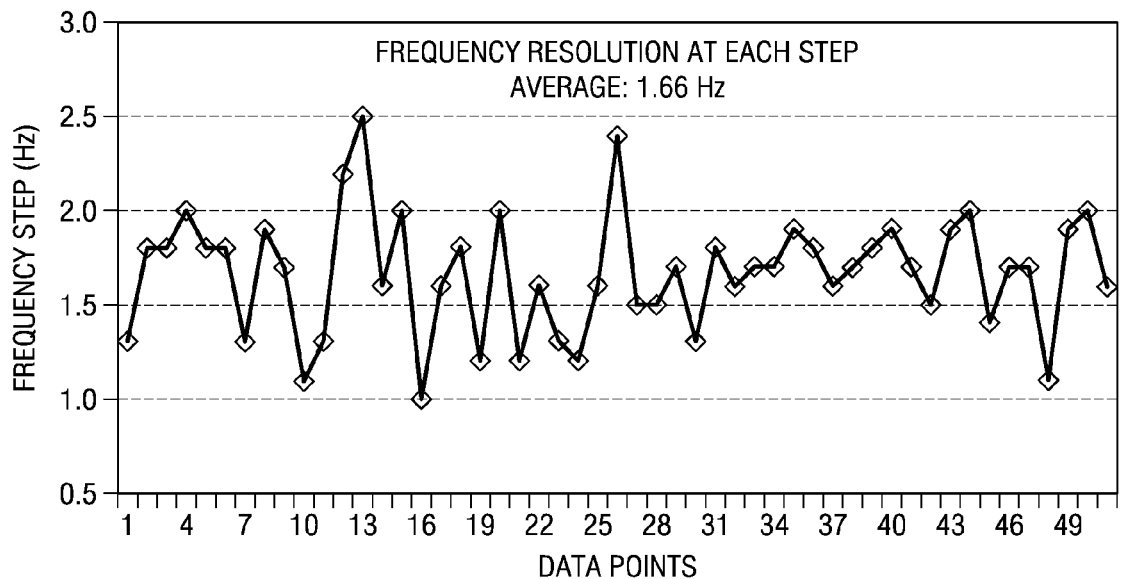
FIG. 6 illustrates the frequency resolution of an example of this invention.

FIG. 6 illustrates the frequency difference between two frequency measurements when FREQ changes by one least significant bit showing an average step of 1.66 Hz.

Figure 7:
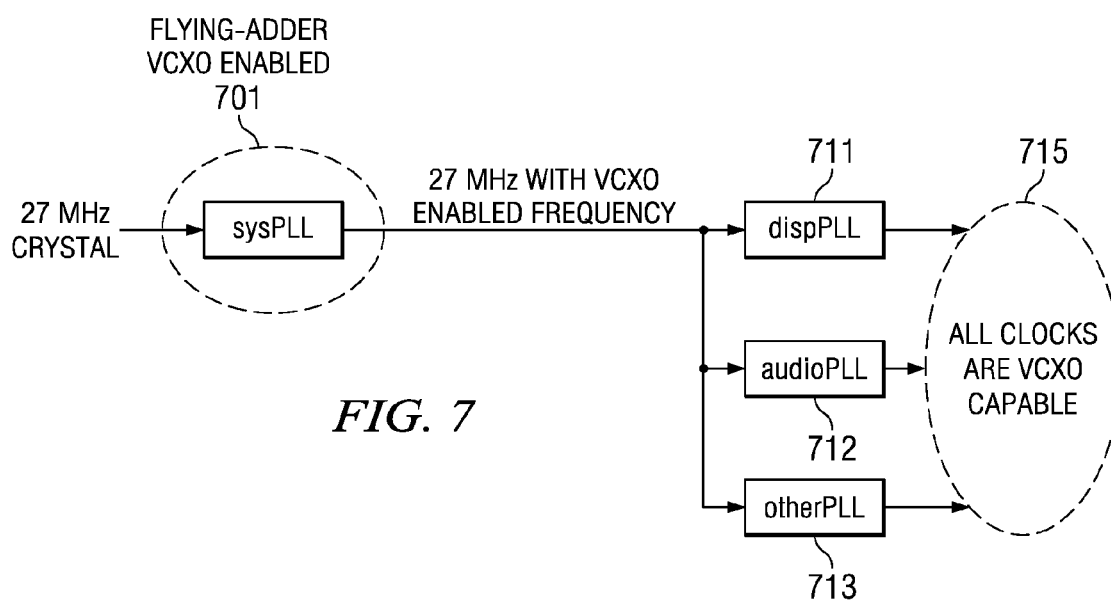
FIG. 7 illustrates an embodiment of this invention employing on flying-adder phase locked loop and plural ordinary phase locked loops.
Figure 8:
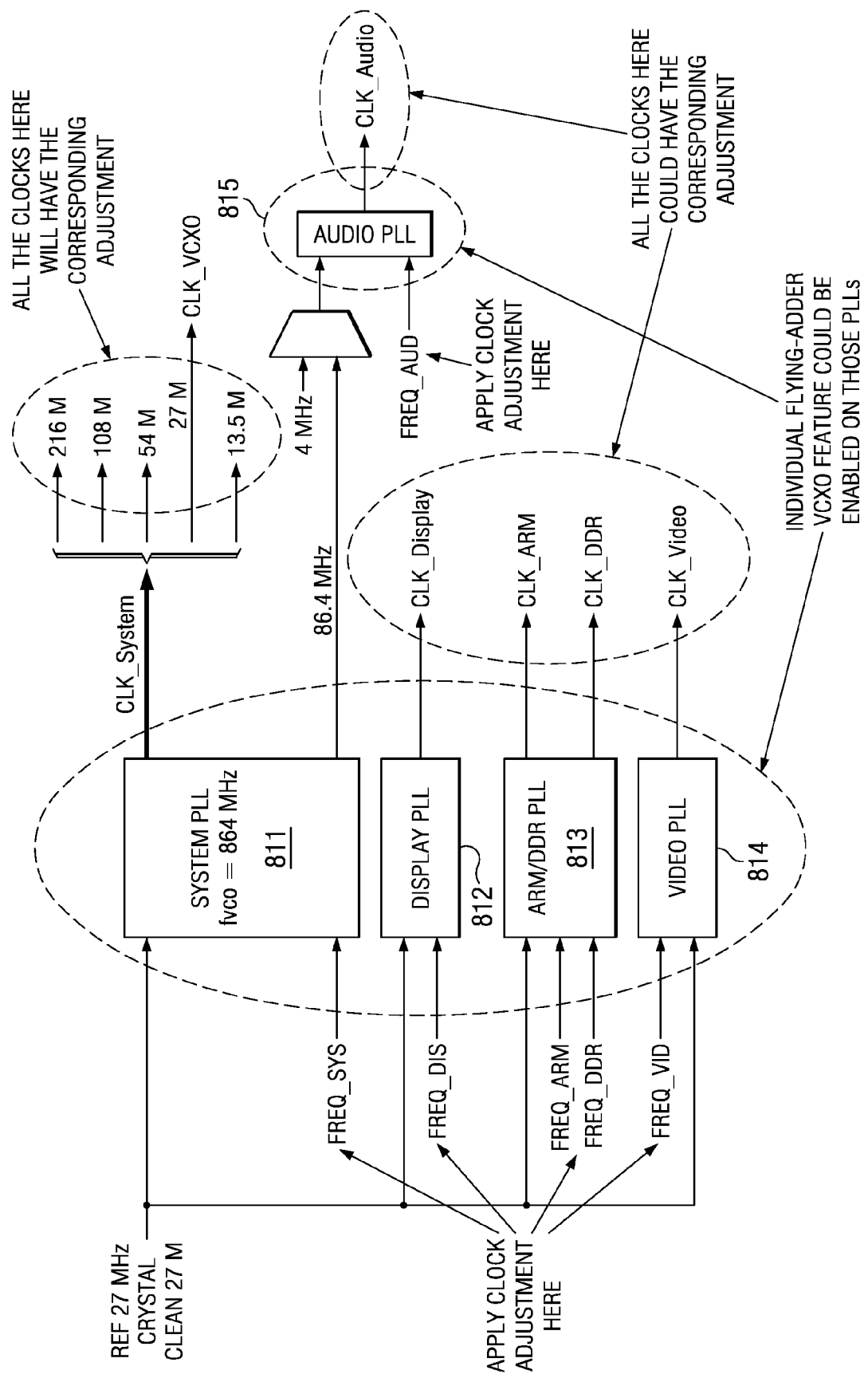
FIG. 8 illustrate another embodiments of this invention using plural flying-adder phase locked loops.

FIGS. 7 and 8 illustrate two alternative embodiments using this invention. In FIG. 7 illustrating the first alternative system PLL 701 includes the flying-adder VCXO synthesizer of this invention. The output of system PLL 701 is a 27 MHz with a dither frequency. This output supplies separate phase locked loops dispPLL 711, audioPLL 712 and otherPLL 713 with supply respective dependent clock signals to circuits 715. In FIG. 8 illustrating the second alternative each of system PLL 811, display PLL 812, ARM/DDR PLL 813, video PLL 814 and audio PLL 815 include the flying-adder VCXO circuit of this invention. As a further alternative, the flying-adder frequency synthesis can be enabled on only those phase locked loops needing this feature.

Figure 9:
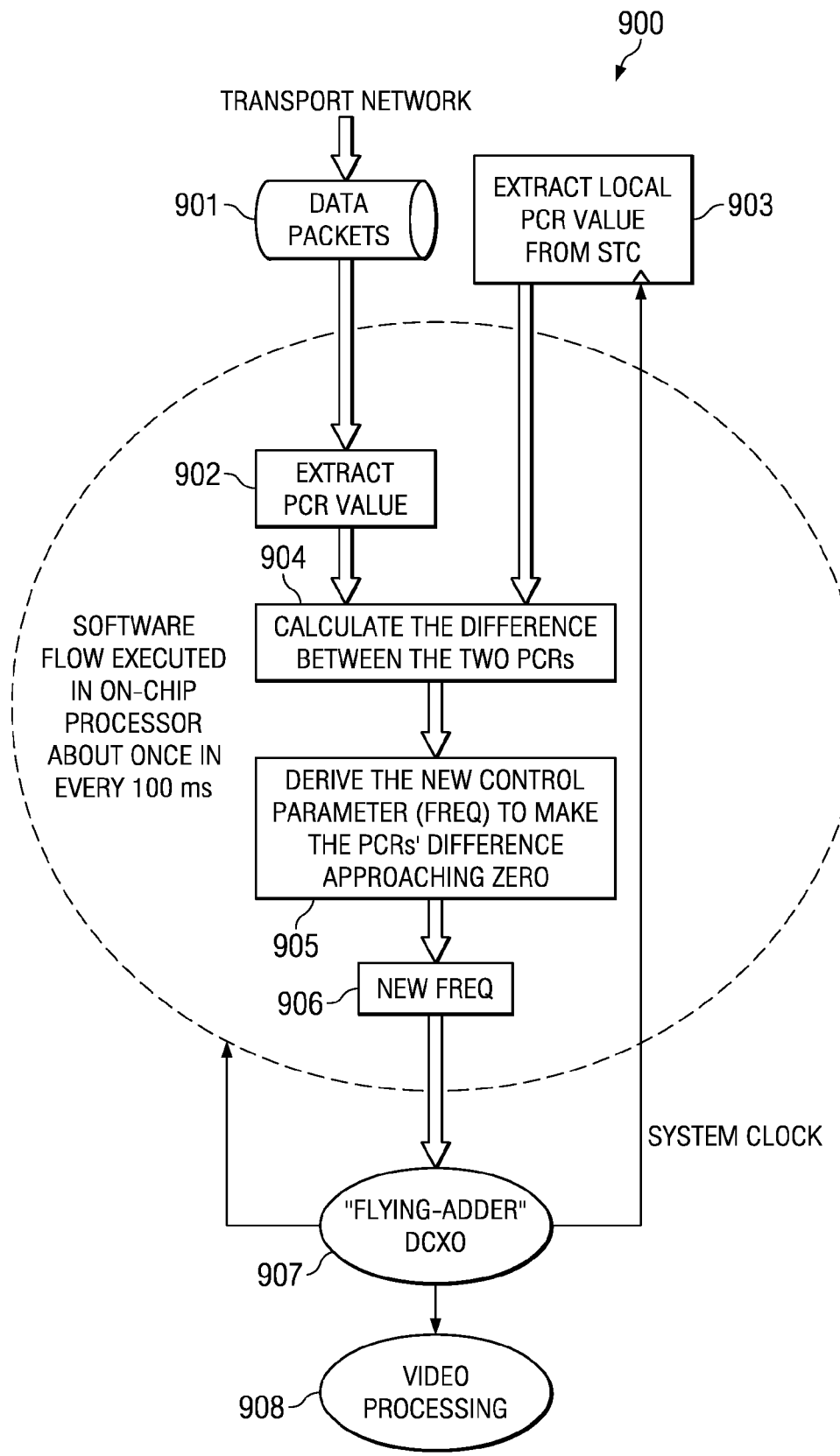
FIG. 9 illustrates the method of this invention.

FIG. 9 illustrates method 900 of this invention. The corresponding transport network supplies input data packets 901. Step 902 extracts the PCR signals from these data packets. Step 903 extracts local PCR signals from the system clock. Step 904 calculates the difference between the time indicated by the two sources of program clock reference signals. Step 905 derives a control parameters corresponding to this difference between the two PCRs. Step 906 produces the new control data word FREQ corresponding to this derived control parameter. As shown in FIG. 9 this process is carried out about every 100 ms corresponding to the MPEG2 required rate of PCRs. Step 907 is the flying-adder frequency synthesis as previously described. Step 907 provides feedback to step 903 to produce the local PCR. Step 907 also produces the properly dither system clock to video processing 908.

What is claimed is:

1. A method of clock generation in a compressed video decoder comprising the steps of:
   receiving a mixed data stream including video data and program clock reference signals;
   stripping the program clock reference signals from the mixed data stream;
   determining a time difference between a time indicated by the program clock reference signals and elapsed real time;
   generating digital control word corresponding to the determined time difference;
   adjusting the frequency of a decoder clock signal according to the digital control word in a flying-adder frequency synthesizer including
      receiving a stable frequency signal,
      detecting a phase difference between the stable frequency signal and a locally generated reference signal,
      controlling the frequency of a locally generated reference signal corresponding to said detected phase difference,
      generating a plurality of local clock signals having the same frequency and respective differing phases evenly disbursed over one cycle,
      periodically adding the digital control word to an accumulated digital word,
      periodically selecting one of the plural local reference signals according to a current accumulated digital word, and
      generating the adjusted frequency decoder clock signal by toggling between digital states for each predetermined digital transition in the selected local clock signal; and
   decoding the video data in the mixed data stream according to the adjusted frequency decoder clock signal.

2. A compressed video decoder embodied in a signal integrated circuit comprising:
   an input for receiving a mixed data stream including video data and program clock reference signals;
   a time stamp processing circuit connected to said input for generating a frequency adjustment signal corresponding to a time difference between a time indicated by the program clock reference signals and elapsed real time;
   a reference clock signal input for receiving a reference clock signal;
   a phase locked loop circuit connected to said reference clock signal input including
      a phase detector having a first input connected to said reference clock signal input, a second input and an output, said phase detector generating a voltage level at said output corresponding to a phase difference between signals at said first and second inputs,
      a voltage controlled oscillator generating a plurality of local clock signals having the same frequency and respective differing phases evenly disbursed over one cycle, one of said plurality of local reference clocks signals supplied to said second input of said phase detector;
   a flying-adder frequency synthesizer receiving said frequency adjustment signal and said plurality of local clocks signals for generating a decoder clock signal adjusted in frequency according to said frequency adjustment signal, said flying-adder frequency synthesizer including
      a multiplexer having a plurality of inputs, a control input and an output, each of said plurality of inputs receiving a corresponding one of said plurality local clock signals, said multiplexer selecting for output at said output a signal on one of said plurality of inputs corresponding to said control input,
      a flip-flop having a clock input connected to said output of said multiplexer and an output forming said decoder clock signal,
      an adder having a first input receiving a digital control word corresponding to said frequency adjustment signal, a second input and an output forming a sum of said first and second inputs, and
      a register for storing a multibit digital control word having an input connected to said output of said adder, a load input connected to said output of said flip-flop and an output connected to said second input of said adder and having a predetermined number of most significant bits connected to said control input of said multiplexer; and
   video processing circuits connected to said input and receiving said decoder clock signal for decoding said video data corresponding to said decoder clock signal.

3. The compressed video decoder of claim 2, further comprising:
   an input frequency divider circuit having an input connected to said reference clock input and an output connected to said first input of said phase detector, said input frequency divider dividing the frequency of said reference clock signal by an integral factor P.

4. The compressed video decoder of claim 2, further comprising:
a feedback frequency divider circuit having an input receiving said one of said plurality of local reference clocks signals and an output connected to said second input of said phase detector, said feedback frequency divider dividing the frequency of said one of said plurality of local reference clocks signals by an integral factor N.

* * * * *